(12) United States Patent
Paik et al.

(10) Patent No.: US 9,496,469 B2
(45) Date of Patent: Nov. 15, 2016

(54) METHOD OF FABRICATING AN OPTICAL DEVICE PACKAGE WITH AN ADHESIVE HAVING A REFLECTIVE MATERIAL

(75) Inventors: Jee Heum Paik, Seoul (KR); Ji Haeng Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/236,039

(22) PCT Filed: Jul. 27, 2012

(86) PCT No.: PCT/KR2012/006010
§ 371 (c)(1),
(2), (4) Date: Jan. 29, 2014

(87) PCT Pub. No.: WO2013/019033
PCT Pub. Date: Feb. 7, 2013

(65) Prior Publication Data
US 2014/0197442 A1    Jul. 17, 2014

(30) Foreign Application Priority Data

Jul. 29, 2011 (KR) ........................ 10-2011-0076047

(51) Int. Cl.
| | | |
|---|---|---|
| *H01L 33/60* | (2010.01) | |
| *H01L 31/0203* | (2014.01) | |
| *H01L 33/54* | (2010.01) | |
| *H01L 33/48* | (2010.01) | |
| *H01L 33/62* | (2010.01) | |
| *H01L 31/0216* | (2014.01) | |

(52) U.S. Cl.
CPC ........... *H01L 33/60* (2013.01); *H01L 31/0203* (2013.01); *H01L 33/486* (2013.01);
(Continued)

(58) Field of Classification Search
CPC ..... H01L 33/54; H01L 33/62; H01L 33/486; H01L 2933/005; H01L 2224/48091; H01L 33/502; H01L 33/52; H01L 33/60; H01L 21/56; H01L 23/3142; H01L 31/0216; H01L 31/0203
See application file for complete search history.

(56) References Cited

U.S. PATENT DOCUMENTS 6,730,942 B2 * 5/2004 Mabuchi ............ C08G 59/1405
257/100
7,615,501 B2 * 11/2009 Haase et al. .................. 438/780
(Continued)

FOREIGN PATENT DOCUMENTS

KR   10-2009-00802990 A    7/2009
KR   10-2010-0133540 A    12/2010
(Continued)

OTHER PUBLICATIONS

International Search Report in International Application No. PCT/KR2012/006010, filed Jul. 27, 2012.

*Primary Examiner* — Alonzo Chambliss
(74) *Attorney, Agent, or Firm* — Saliwanchik, Lloyd & Eisenschenk

(57) ABSTRACT

Provided are an optical device package and a method of manufacturing the same. The method of manufacturing the optical device package according to an exemplary embodiment of the present invention comprises: forming an adhesive layer showing predetermined reflectance or more on an insulating layer; forming a metal layer on the adhesive layer; forming a circuit pattern layer by etching the metal layer; and mounting an optical device on the circuit pattern layer. According to the present invention, the adhesive layer showing the predetermined reflectance or more rather than a transparent adhesive layer is formed, whereby thanks to the adhesive layer exposed by the etched part of the circuit pattern layer, the light can be prevented from being trapped. Thus, it is advantageous that luminous intensity of the optical device package increases.

8 Claims, 2 Drawing Sheets

(52) U.S. Cl.
CPC ............ *H01L 33/54* (2013.01); *H01L 33/62* (2013.01); *H01L 31/0216* (2013.01); *H01L 2224/45139* (2013.01); *H01L 2224/48091* (2013.01); *H01L 2933/0066* (2013.01)

(56) References Cited

U.S. PATENT DOCUMENTS

| | | | |
|---|---|---|---|
| 8,138,512 B2* | 3/2012 | Kang et al. | 257/98 |
| 2001/0022997 A1* | 9/2001 | Honda et al. | 428/1.31 |
| 2004/0028895 A1* | 2/2004 | Yamakami | B32B 27/08 428/354 |
| 2004/0099874 A1* | 5/2004 | Chang et al. | 257/98 |
| 2004/0100423 A1* | 5/2004 | Nagakubo et al. | 345/40 |
| 2005/0007000 A1* | 1/2005 | Chou et al. | 313/116 |
| 2009/0078455 A1* | 3/2009 | Takakusaki et al. | 174/260 |
| 2011/0039374 A1* | 2/2011 | Lin et al. | 438/118 |

FOREIGN PATENT DOCUMENTS

| | | |
|---|---|---|
| KR | 10-1000860 B1 | 12/2010 |
| KR | 10-1051690 B1 | 7/2011 |
| WO | WO-2010-061433 A1 | 6/2010 |

* cited by examiner

METHOD OF FABRICATING AN OPTICAL DEVICE PACKAGE WITH AN ADHESIVE HAVING A REFLECTIVE MATERIAL

CROSS-REFERENCE TO RELATED APPLICATIONS

This application is the U.S. national stage application of International Patent Application No. PCT/KR2012/006010, filed Jul. 27, 2012, which claims priority to Korean Application No. 10-2011-0076047, filed Jul. 29, 2011, the disclosures of each of which are incorporated herein by reference in their entirety.

TECHNICAL FIELD

Exemplary embodiment of the present invention relates to an optical device package and a method of manufacturing the same.

BACKGROUND ART

In general, an optical device, namely, a light emitting diode (LED) is called an inter-metallic compound joining diode which produces minority carriers (electrons or electron holes) injected using a p-n junction structure of a semiconductor, and emits light by changing electrical energy into light energy due to a recombination of these carriers. That is, when a forward voltage is applied to a semiconductor of a specific element, electrons and electron holes are rejoined each other while the electrons and electron holes move through a junction part of a positive pole and a negative pole. At this time, since energy smaller than when the electrons and the electron holes are apart is generated, the light is emitted due to a difference of the generated energy. This LED is applied to a lighting device or a backlight device of an LCD device as well as a general display device, and its application range has been gradually diversified.

FIG. 1 illustrates a cross-section view of an optical device package according to a conventional art.

Referring to FIG. 1, the optical device package according to a conventional art includes an insulating layer 30 on which via holes are formed, an adhesive layer 31 formed on one surface of the insulating layer 30, a metal layer 34 attached onto the adhesive layer 31, and an optical device 37 mounted on a part of the metal layer 34 exposed to the outside through the via holes.

The optical device package of FIG. 1 is manufactured according to a process illustrated in FIG. 2.

FIG. 2 is a view showing a manufacturing process of the optical device package according to the conventional art.

Referring to FIG. 2, the adhesive layer 31 is first applied to one surface of the insulating layer 30 (S1). Here, the insulating layer 30 is generally implemented using a polyimide film. After the adhesive layer 31 is applied to the insulating layer 30, via holes 33 are formed on the insulating layer 30 (S2).

Next, the metal layer 34 is laminated on the adhesive layer 31. The metal layer 34 is preferably composed of Cu. Since then, after a surface of the metal layer is activated through several chemical treatments, photoresist is applied thereto, and an exposure process and a developing process are carried out. After the developing process is completed, a necessary circuit is formed through an etching process, and a circuit pattern layer 35 is formed by making the photoresist thin (S4). In other words, the circuit pattern layer 35 is formed by etching the part of the metal layer 34 along a predetermined pattern. Thus, the adhesive layer 31 is exposed by an etched part 40 of the circuit pattern layer 35.

By the way, since the adhesive layer 31 is generally formed of an adhesive of a transparent material, the insulating layer 30 passing through the adhesive layer is exposed to the etched part 40 of the circuit pattern layer 35. Since the polyimide which forms the insulating layer 30 has brown, the etched part 40 of the circuit pattern layer 35 appears brown.

Light emitted from the optical device 37 is reflected by a lens 9 (not shown) which covers an upper part of the optical device package 37 to thereby hit against the metal pattern layer 35 on which the optical device is mounted. The light hit against the circuit pattern layer 35 is reflected by the circuit pattern layer 35. The light hit against the etched part of the circuit pattern layer 35 is not reflected by the brown insulating layer 30, but is trapped. As a result, it is problematic that luminous intensity of the optical device package is deteriorated.

To prevent the light emitted from the optical device 37 from being trapped, a printing process has been added to thereby print a white solder resist on the etched part of the circuit pattern layer 35 or a method of reducing a pattern space of an isolated part has been used. However, this generates the problems such as an increase in process costs and restrictions on a pattern design.

DISCLOSURE OF INVENTION

Technical Problem

An aspect of Exemplary embodiment of the present invention provides an optical device package and a method of manufacturing the same, which increases luminance intensity.

Solution to Problem

According to an aspect of exemplary embodiment of the present invention, there is provided a method of manufacturing an optical device package, the method comprising: forming an adhesive layer showing predetermined reflectance or more on an insulating layer; forming a metal layer on the adhesive layer; forming a circuit pattern layer by etching the metal layer; and mounting an optical device on the circuit pattern layer.

Furthermore, according to another aspect of exemplary embodiment of the present invention, there is provided an optical device package comprising: an insulating layer an adhesive layer formed on the insulating layer and showing predetermined reflectance or more; a metal layer formed on the adhesive layer and patterned; and an optical device mounted on the metal layer, wherein the adhesive layer is exposed by an etched part of the metal layer.

The adhesive layer may be formed of a white adhesive. For example, the white adhesive may be white PET (polyethylen terephthalate).

The adhesive layer may be formed of an adhesive with colors showing predetermined reflectance or more.

The adhesive layer may be formed of another adhesive including a reflective material.

The reflective material may include a metallic material. In this case, the adhesive may be transparent.

The insulating layer may be manufactured of polyimide.

Advantageous Effects of Invention

According to exemplary embodiment of the present invention, the adhesive layer showing predetermined reflectance or more rather than a transparent adhesive layer is formed, whereby thanks to the adhesive layer exposed by the etched part of the circuit pattern layer, light is prevented from being trapped. As a result, it is advantageous that luminous intensity of the optical device package increases.

BRIEF DESCRIPTION OF DRAWINGS

The accompanying drawings are included to provide a further understanding of exemplary embodiment of the present invention, and are incorporated in and constitute a part of this specification. The drawings illustrate exemplary embodiments of the present invention and, together with the description, serve to explain principles of the present invention. In the drawings.

BEST MODE FOR CARRYING OUT THE INVENTION

Figure 1:
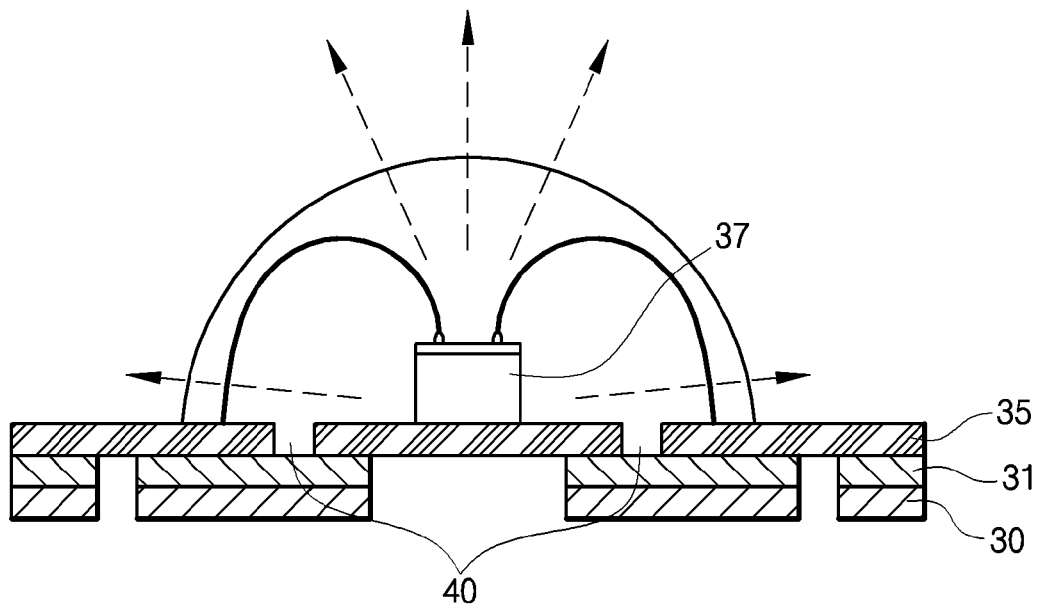
FIG. 1 illustrates a cross-section view of an optical device package according to a conventional art.
Figure 2:
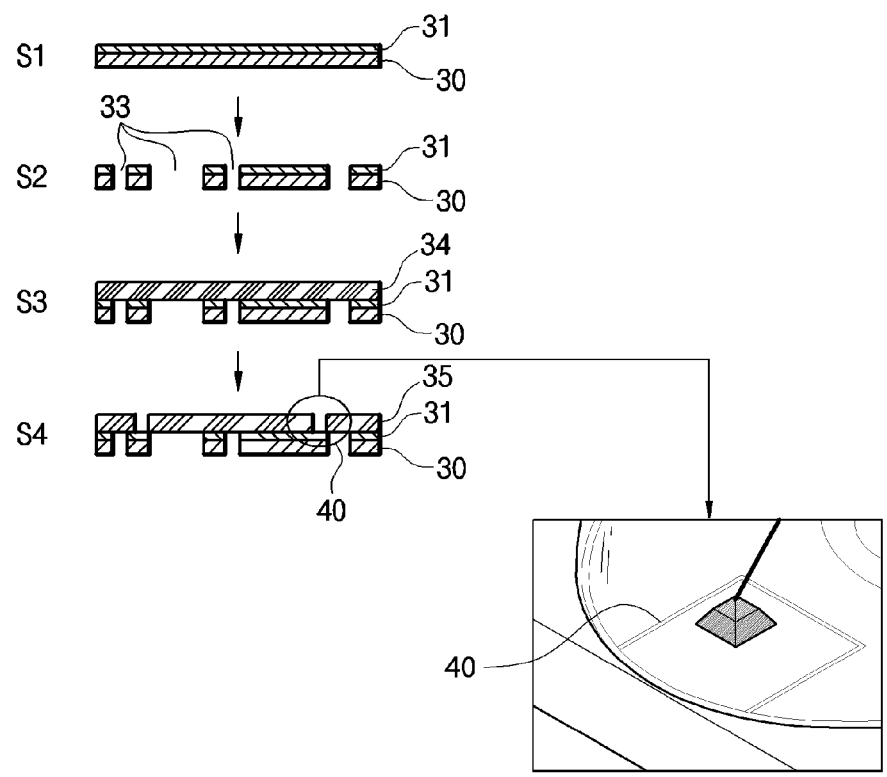
FIG. 2 is a view showing a manufacturing process of the optical device package according to the conventional art.

Exemplary embodiments according to the present invention will now be described more fully hereinafter with reference to the accompanying drawings so that those having ordinary skill in the art can easily embody. This invention may, however, be embodied in different forms and should not be construed as limited to the exemplary embodiments set forth herein. To clearly explain exemplary embodiment of the present invention, in the drawings, the parts which have no relation with the explanation are omitted. Like numbers refer to like elements throughout the specification.

Hereinafter, the detailed technical contents to be carried out by exemplary embodiment of the present invention will be described in detail with reference to the accompanying drawings.

Figure 3:
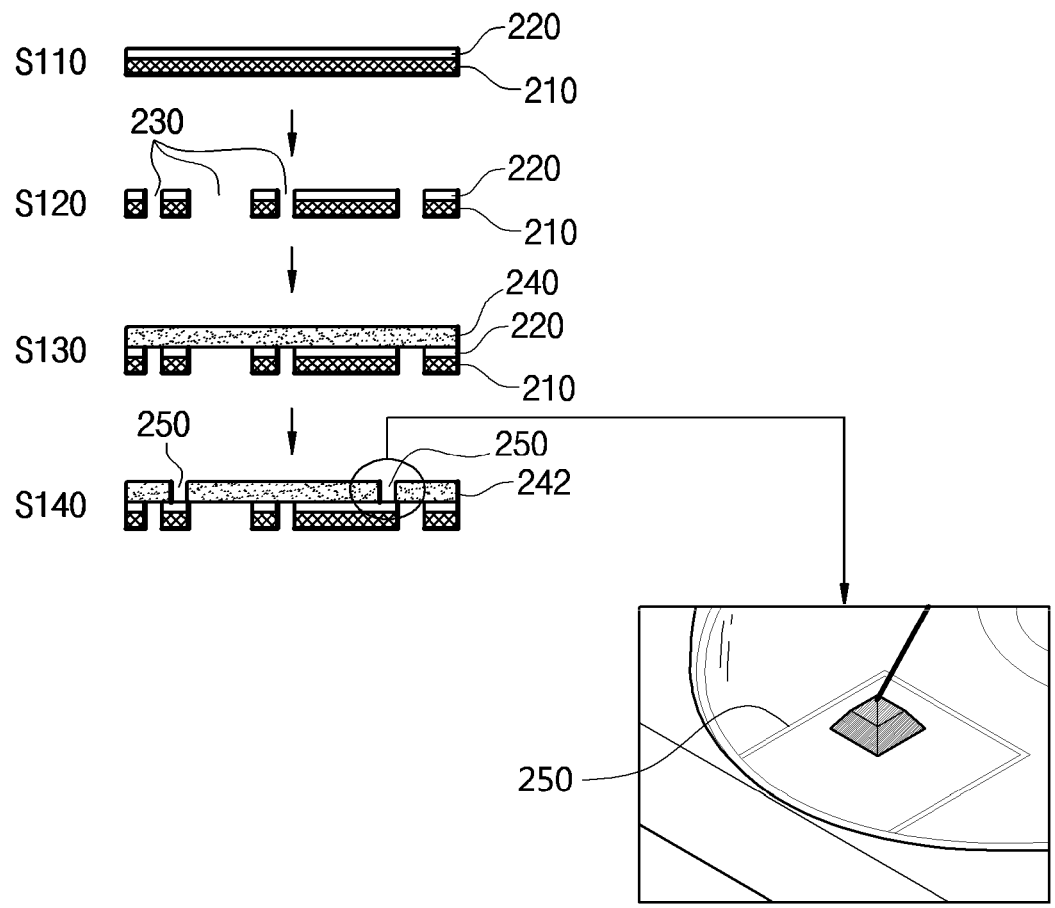
FIG. 3 is a view showing a manufacturing process of an optical device package according to an exemplary embodiment of the present invention.
Figure 4:
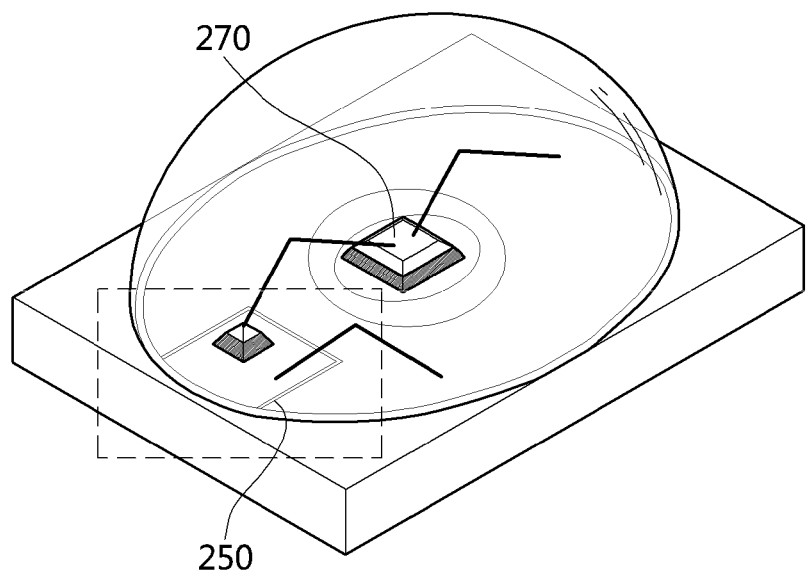
FIG. 4 is a perspective view illustrating the optical device package formed by the manufacturing process of FIG. 3.

FIG. 3 is a view showing a manufacturing process of an optical device package according to an exemplary embodiment of the present invention. FIG. 4 is a perspective view illustrating the optical device package formed by the manufacturing process of FIG. 3.

Referring to FIG. 3 and FIG. 4, an adhesive layer 220 is applied to one surface of an insulating layer 210 (S110). Here, the insulating layer 210 may be a polyimide film, but not limited to this, and may be manufactured of a ceramic material which is resistant to a heat impact. Furthermore, the insulating layer 210 may have a film shape. In this case, the insulating layer may be manufactured in large quantities by using a roll-to-roll process.

After the adhesive layer 220 is applied to the insulating layer 210, via holes 230 are formed on the insulating layer 210 (S120). The adhesive layer 220 may be formed of a white adhesive. Here, the via holes 230 formed by passing through the insulating layer 210 may include a via hole on which an optical device 270 is mounted, a via hole for electrically connecting each layer, a thermal via hole for easily diffusing heat, and a via hole which is a standard to align each layers.

Next, a metal layer 240 may be laminated on the adhesive layer 220. The metal layer 240 may be composed of Cu.

Since then, after a surface thereof is activated through several chemical treatments, photoresist is applied thereto, and an exposure process and a developing process are carried out. After the developing process is completed, a necessary circuit is formed by an etching process, and a circuit pattern layer 242 is formed by making the photoresist thin (S140).

The adhesive layer 220 is exposed by an etched part 250 of the circuit pattern layer 242. The adhesive layer 220 shows predetermined reflectance or more. That is, the adhesive layer 220 shows reflectance which is equal to or more than the predetermined reflectance.

According to an exemplary embodiment, the adhesive layer 220 may be formed of an adhesive with colors showing 50% or more reflectance. White color shows 90% or more reflectance. Thus, the adhesive layer 220 may be formed of a white adhesive. Here, for the white adhesive, any materials which are obvious to those having ordinary skill in the art may be used. For example, the adhesive may include white PET (polyethylen terephthalate).

Alternatively, the adhesive layer 220 may be formed of another adhesive with colors having high reflectance except for white color, namely, colors showing predetermined reflectance or more. For example, the adhesive layer 220 may be formed of an adhesive with colors having high brightness such as bright yellow, bright sky-blue, bright pink and the like. To achieve this, the adhesive may be formed by adding a dye of desired color to a transparent adhesive. When the adhesive layer 220 is exposed by the circuit pattern layer 242, its visual esthetic sense may be provided.

Meanwhile, the adhesive may include resin. Here, the resin may be formed of a material including at least one of epoxy resin, acrylic resin, polyimide resin. In particular, the epoxy resin or polyimide resin may be used. Furthermore, for the polyimide resin, thermoplastic polyimide may be mainly used. However, thermosetting polyimide resin may be also used. However, this is only one example and the adhesive layer of the present exemplary embodiment of the invention may be formed of all resins having an adhesive property which have been currently developed and commercialized or will be implemented according to future technology development. To these materials for forming the adhesive layer, various natural rubbers, flame retarding materials such as a plasticizer, a hardening agent, a phosphorus compound and various other additives may be added with a view to have flexibility.

According to another exemplary embodiment, the adhesive layer 220 may be formed of another adhesive including a reflective material. The reflective material may include a metallic material. Any reflective materials used by those having ordinary skill in the art may be used. In this case, the adhesive may be a transparent adhesive or a colored adhesive. If the adhesive is transparent, an amount of the reflective material should be included in the adhesive to be enough that the adhesive layer shows the predetermined reflectance.

As a result, when the light hit against the etched part 250 of the circuit pattern layer 242, the light may be reflected from the adhesive layer 220. After this, the circuit pattern layer 242 may be plated of a metallic material, for example, Ag so that the light can be reflected from the circuit pattern layer 242.

Next, as illustrated in FIG. 4, the optical device 270 is mounted on the metal pattern layer 242. And then, the optical device 270 and the circuit pattern layer 242 are electrically connected to each other using a wire.

The light emitted from the optical device 270 hits against the circuit pattern layer 242 due to a reflection lamp. The light hit against the circuit pattern layer 242 is reflected. Furthermore, the light hit against the etched part 250 of the circuit pattern layer 242 is reflected by the adhesive layer 220 exposed through the etched part.

As described above, the adhesive layer 220 shows the predetermined reflectance or more. To achieve this, the adhesive layer 220 may be formed of the adhesive with colors showing the predetermined reflectance or more. In this case, the exposed adhesive layer 220 has white or colors having high brightness. Thus, the light hit against the exposed adhesive layer 220 is reflected by the exposed the adhesive layer 220 depending upon optical characteristics owned by the colors, namely, light reflecting characteristics.

Alternatively, the adhesive layer 220 may be formed of the adhesive including the reflective material. In this case, the light may be reflected by hitting against the reflective material of the exposed adhesive layer 220.

Accordingly, compared to the optical device package in which the adhesive layer is formed of an existing transparent adhesive, the optical device package according to the present exemplary embodiment of the invention has increased luminous intensity, namely, increased luminous flux efficiency.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

The invention claimed is:

1. A method of manufacturing an optical device package comprising:
   forming an adhesive layer on an insulating layer, wherein the adhesive layer has a reflectance of 50% or more and is a colored adhesive;
   forming a metal layer on the adhesive layer;
   forming a circuit pattern layer by etching the metal layer;
   mounting an optical device on the circuit pattern layer; and
   forming a lens on the circuit pattern layer to cover the circuit pattern layer, the optical device, and a surface of the adhesive layer exposed by the etching;
   wherein the surface of the adhesive layer covered by the lens is a reflective surface to reflect a light reflected by the lens;
   wherein the reflective surface has a high brightness color including at least one of bright yellow, bright sky-blue, and bright pink;
   wherein the optical device is disposed higher than a top surface of the adhesive layer, and
   wherein the light reflected by the lens is reflected by the reflective surface of the adhesive layer.

2. The method of claim 1, wherein the adhesive layer includes a reflective material.

3. The method of claim 2, wherein the reflective material includes a metallic material.

4. The method of claim 1, wherein the insulating layer is polyimide.

5. An optical device package comprising:
   an insulating layer;
   an adhesive layer on the insulating layer, wherein the adhesive layer has a reflectance of 50% or more and is a colored adhesive;
   a metal layer on the adhesive layer and patterned;
   an optical device on the metal layer; and
   a lens on the metal layer and covering the metal layer, the optical device, and a surface of the adhesive layer;
   wherein the surface of the adhesive layer is exposed by an etched part of the metal layer,
   wherein the surface of the adhesive layer covered by the lens is a reflective surface to reflect a light reflected by the lens;
   wherein the reflective surface has a high brightness color including at least one of bright yellow, bright sky-blue, and bright pink:
   wherein the optical device is disposed higher than a top surface of the adhesive layer, and
   wherein the optical device package is configured such that the light reflected by the lens is reflected by the exposed reflective surface of the adhesive layer.

6. The optical device package of claim 5, wherein the adhesive layer includes a reflective material.

7. The optical device package of claim 6, wherein the reflective material includes a metallic material.

8. The optical device package of claim 5, wherein the insulating layer is polyimide.

* * * * *